US006825562B2

(12) United States Patent
Naik et al.

(10) Patent No.: US 6,825,562 B2
(45) Date of Patent: Nov. 30, 2004

(54) DAMASCENE STRUCTURE FABRICATED USING A LAYER OF SILICON-BASED PHOTORESIST MATERIAL

(75) Inventors: Mehul B. Naik, San Jose, CA (US); Tim Weidman, Sunnyvale, CA (US); Dian Sugiarto, Union City, CA (US); Allen Zhao, Mountain View, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 10/290,637

(22) Filed: Nov. 8, 2002

(65) Prior Publication Data

US 2003/0062627 A1 Apr. 3, 2003

Related U.S. Application Data

(62) Division of application No. 09/788,164, filed on Feb. 16, 2001, now Pat. No. 6,514,857, which is a division of application No. 09/017,350, filed on Feb. 2, 1998, now Pat. No. 6,204,168.

(51) Int. Cl.[7] .......................... H01L 23/48; H01L 23/52
(52) U.S. Cl. ...................... 257/758; 257/762; 257/774; 438/637; 438/638; 438/700; 438/788
(58) Field of Search ........................... 257/774, 758, 257/762, E21.57, E21.26, E21.25, E21.2; 438/637, 638, 700, 788, 795

(56) References Cited

U.S. PATENT DOCUMENTS

| | | | |
|---|---|---|---|
| 5,120,622 A | 6/1992 | Hanrahan | 430/321 |
| 5,262,354 A | 11/1993 | Cote et al. | 438/645 |
| 5,290,899 A | * 3/1994 | Tanaka et al. | 528/15 |
| 5,371,042 A | 12/1994 | Ong | 438/653 |
| 5,399,462 A | 3/1995 | Sachdev et al. | 430/323 |
| 5,439,780 A | 8/1995 | Joshi et al. | 430/296 |
| 5,443,995 A | 8/1995 | Nulman | 438/654 |
| 5,614,765 A | 3/1997 | Avanzino et al. | 257/774 |
| 5,635,423 A | 6/1997 | Huang et al. | 438/638 |
| 5,741,626 A | 4/1998 | Jain et al. | 216/18 |
| 5,801,099 A | 9/1998 | Kim et al. | 438/666 |
| 5,866,920 A | 2/1999 | Matsumoto et al. | 257/63 |
| 5,877,075 A | 3/1999 | Dai et al. | 438/597 |
| 5,886,410 A | 3/1999 | Chiang et al. | 257/759 |
| 5,920,790 A | 7/1999 | Wetzel et al. | 438/618 |
| 5,972,570 A | 10/1999 | Bruce et al. | 430/313 |
| 6,042,999 A | 3/2000 | Lin et al. | 430/313 |
| 6,090,530 A | 7/2000 | Weidman et al. | 427/489 |
| 6,100,184 A | * 8/2000 | Zhao et al. | 438/638 |
| 6,242,344 B1 | 6/2001 | Koh et al. | 438/638 |
| 6,331,380 B1 | 12/2001 | Ye et al. | 430/311 |

* cited by examiner

Primary Examiner—Hsien Ming Lee
(74) Attorney, Agent, or Firm—Moser, Patterson & Sheridan (57) ABSTRACT

A damascene structure, and a method of fabricating same, containing relatively low dielectric constant materials (e.g., k less than 3.8). A silicon-based, photosensitive material, such as plasma polymerized methylsilane (PPMS), is used to form both single and dual damascene structures containing low k materials. During the manufacturing process that forms the damascene structures, the silicon-based photosensitive material is used as both a hard mask and/or an etch stop.

9 Claims, 7 Drawing Sheets

DAMASCENE STRUCTURE FABRICATED USING A LAYER OF SILICON-BASED PHOTORESIST MATERIAL

CROSS-REFERENCE TO RELATED APPLICATIONS

This application is a divisional of U.S. patent application Ser. No. 09/788,164, filed Feb. 16, 2001, now U.S. Pat. No. 6,514,857which is a divisional of application Ser. No. 09/017,350 filed Feb. 2,1998 now U.S. Pat. No. 6,204,168, issued Mar. 20, 2001, both of which are hereby incorporated by reference in their entirety.

BACKGROUND OF THE DISCLOSURE

1. Field of the Invention

The invention relates to semiconductor devices containing an interconnection structure comprising conductive wiring and conductive vias on a substrate and, more particularly, to a damascene structure that defines conductive paths and/or vias on a substrate and a method of fabricating same.

2. Description of the Background Art

The escalating requirements of density and performance associated with ultra large scale integrated circuits require responsive changes in interconnection technology. High density integrated circuits require planarized layers of interconnection paths and vias with minimal spacing between conductive paths. U.S. Pat. No. 5,262,354 discloses a three-step damascene technique for forming electrically conductive vias and interconnection lines on a substrate. Additionally, in U.S. Pat. No. 5,635,423, a simplified dual damascene process is disclosed for providing a multi-level metallization and interconnection structure wherein conductive vias and paths are formed simultaneously.

The dual damascene process taught in the '423 patent involves forming a first insulative layer (e.g., a layer of silicon oxide) upon a substrate and a silicon nitride etch stop layer upon the first insulative layer. A second insulative layer (e.g., silicon oxide) is formed on the etch stop layer and a first opening of about the size of the ultimate via is formed in the second insulative layer. Using a mask, a trench is formed in the second insulative layer while simultaneously forming a via in the etch stop and the first insulative layer. Subsequently, the mask is removed and a conductive material is simultaneously deposited in the via and trench.

Existing dual damascene processes utilize silicon dioxide as the insulator between the substrate and the conductive path, as well as between conductive paths. Also, the conventional dual damascene process uses silicon nitride as an etch stop to prevent distortion of the via size during the final etch step. The final etch step is generally used to create the via, as well as the interconnection trench, prior to filling the via and interconnection with a conductive material. The use of silicon nitride as an etch stop and a conventional photoresist to define the trench in the second insulative layer can provide for very high selectivity for the etch process.

As integrated circuits have become more dense and switching speeds have increased, the materials used to fabricate the circuits and the conductive interconnections have been scrutinized. To reduce signal delay and cross-talk between conductive interconnections, insulative materials with low dielectric constants (e.g., k<3.5), known as "low k materials", are becoming widely used, e.g., these materials are sold under the tradenames Flare 2.0, PAE-2, FPI, BCB, and the like. However, when organic or carbon-based low k materials (e.g., amorphous fluorinated carbon (a-C:F)) are used as the insulative layer within a single or dual damascene structure, the etch selectivity to conventional photoresist is poor when using an oxygen-based etch chemistry. In such situations, the dual damascene process sequence is conventionally modified to incorporate a "hard mask" fabricated of silicon dioxide or silicon nitride to define the trench. Such a silicon dioxide hard mask is not etched by the oxygen chemistry. Additionally, silicon nitride or silicon dioxide etch stop is also still used within the dual damascene structure. Consequently, the conventional low k dual damascene structure utilizes a material for the etch stop and hard mask that is distinct from the structure materials. Additionally, the hard mask and etch stop materials must be patterned using conventional photoresist techniques, necessitating numerous processing steps.

There has also been development in the use of plasma polymerized methylsilane (PPMS) material and other radiation sensitive organo-silicon materials as photoresists. The use of PPMS as a photoresist is disclosed in U.S. Pat. No. 5,439,780 issued Aug. 8, 1995 and herein incorporated by reference. Such radiation sensitive materials have not heretofore been used in conjunction with integrated circuit structures that include low k dielectric materials.

Therefore, there is a need in the art for a damascene structure and a method of fabricating such a structure that uses a photosensitive, silicon-based resist material which can function as a good hard-mask or etch-stop for patterning low k materials.

SUMMARY OF THE INVENTION

The invention overcomes the disadvantages associated with the prior art by providing a method of fabricating a damascene structure containing an insulative material having a low dielectric constant (e.g., k<3.5), hereinafter referred to as a low k material, using a silicon-based, organic material such as plasma polymerized methylsilane (PPMS) as a hard mask, etch stop and photoresist material. Both single and dual damascene structures benefit from such a use of silicon-based, organic material.

The process by which a dual damascene structure is fabricated in accordance with the invention begins by applying a film of low k material onto a semiconductor substrate; a layer of PPMS or other photosensitive silicon-based, resist material is deposited upon the low k film; and the resist is exposed to UV light according to a specific pattern for a via. When PPMS is used, the area of the PPMS layer exposed to the UV light is converted to plasma polymerized methylsilane oxide (PPMSO) and the unexposed area remains PPMS. The imaged layer is then developed by removing the PPMS using a chlorine ($Cl_2$) or $Cl_2$/HBr-based etchant to form a patterned layer of PPMSO. In this step, the underlying low k film is not affected by the etchants. Next, an additional low k film is deposited over the patterned PPMS layer. Thereafter, another layer of PPMS is uniformly deposited onto the second low k film. The second PPMS layer is exposed to UV light according to an interconnect pattern (i.e., the surface of the PPMS is masked), where the exposed area is converted to PPMSO and the unexposed area remains PPMS. The PPMS is etched with chlorine ($Cl_2$) or $Cl_2$/HBr-based etchant to define the interconnect pattern defining a trench.

The etch chemistry is then changed and the exposed layers of low k film are etched using an oxygen-based chemistry. The second layer of PPMSO behaves essentially as would a hard mask as it is not affected by the oxygen chemistry, while the first layer of PPMSO serves as an etch stop. The result of the etch is a dual damascene structure having at least one trench interconnected with a via. The dual damascene structure is then metallized and planarized to simultaneously form a conductive via and interconnection line. Planarization of the metallization is accomplished using, for example, chemical-mechanical polishing. The metallization is then conventionally passivated. Generally, passivation is accomplished using an $H_2$-based chemistry to clean the surface oxide, followed by deposition of a layer of, for example, silicon-nitride, to prevent the copper surface from damage through the next series of steps needed to complete the next layer within the integrated circuit. For example, a cure process for a low k material may require a high temperature (400–450° C.) $O_2$-based atmosphere that can severely oxidize the copper and increase the via/trench interface resistance among other detrimental effects. Additionally, low k material etch requires an $O_2$-based chemistry that can also oxidize the exposed copper, if any.

The PPMSO has a very high resistance to oxygen plasma, with etch selectivity greater than 50 compared to the low k films being etched in an oxygen based chemistry. It is this high resistance to oxygen plasma that makes the PPMSO an excellent etch stop for etching low k materials when using an oxygen-based plasma.

To form a single damascene structure, a first layer of low k material is deposited upon a substrate and a layer of PPMS (or another silicon-based resist material) is deposited upon the layer of low k material. The PPMS is then masked and exposed to UV light to form PPMSO at the exposed regions of the mask. A chlorine etch chemistry is used to remove the PPMS and form a patterned layer of PPMSO. The pattern defines locations for vias through the first layer of low k material. An oxygen-based etch chemistry is then used to remove the low k material at the via location. As such, the patterned layer of PPMSO is used as a hard mask during the oxygen-based etch process.

Next, a metallization layer is deposited over the via pattern and the layer is planarized such that only the via is filled with metallization. A copper passivation layer is deposited over the planarized structure. As mentioned above, the passivation is accomplished using an $H_2$-based chemistry to clean the copper and then depositing, for example, a silicon-nitride layer over the copper.

The foregoing steps are repeated to form a trench that connects to the via. Specifically, a second low k material layer is deposited over the passivation layer; a second PPMS/PPMSO layer is deposited, patterned and etched; an oxygen-based etchant is used to etch the low k material to form a trench; a fluorine-based chemistry is then used to remove the passivation layer; the trench is metallized and planarized; and the planarized trench metal is passivated as previously described. The result is a single damascene structure that is formed using a silicon-based, photoresist material (e.g., PPMS) as a hard mask during the oxygen-based chemistry etching steps.

Another important feature of the present invention is that a dual damascene structure can be fabricated using a single lithography step and single development and pattern transfer etch sequence. This application of the invention takes advantage of the combination of unique features of a PPMS resist. Specifically, the invention utilizes the ability to control the degree of photo-oxidation with UV exposure, which in turn determines the amount of PPMS or PPMSO (depending on development process tone) that remains on the device. This allows the formation of a bilevel hard mask structure using a single lithography step employing a two-tone (grey-scale) mask, or a sequence of exposures using two standard masks. This approach is aimed specifically at the patterning of dual damascene structures in low k organic polymer or amorphous carbon based films, which may be etched with high selectivity through a PPMS/PPMSO masking layer using an oxygen based plasma.

When using a negative tone process, the combination of trench and contact vias are patterned in a single step using a grey level mask (i.e., one having clear, partially absorbing (grey) areas, and totally absorbing areas) or a sequence of two ordinary masks so as to create a pattern in which some areas are totally exposed, some areas partially exposed, and some areas unexposed. For negative tone applications those areas of the dielectric stack intended to remain after etching are completely exposed, those areas to be removed in the upper layer of low k dielectric (the trench) are partially exposed, and those areas to be removed in both layers (i.e., the contact vias) remain unexposed.

The PPMS development, trench, and via etch may then conducted in a single etch sequence. PPMS development is performed using a $Cl_2$ or $Cl_2$/HBr based plasma etch for a time sufficient to remove all of the completely unexposed PPMS and part of the partially exposed PPMS. The amount of PPMS left behind in the partially exposed area will depend on the relative amount of light (i.e., the percent transmission of the grey tone mask area) and the total etch time (including overetch time) necessary to clear the unexposed regions of PPMS. The thickness of material remaining in the partially exposed area is thereby controlled by choice of initial film thickness, exposure level, and overetch time such that the remaining material may be removed in the same etch time necessary to subsequently remove a thin inorganic (oxide or nitride layer) etch stop layer between the two layers of organic dielectric material.

Next, the etch gases are switched to an oxygen based mixture (including pure oxygen, or oxygen with $N_2$, $CO_2$, CO, $SO_2$, or other additives) so as to selectively and anisotropically etch through the top layer of the organic low k dielectric and stop on the thin inorganic etch stop layer. Under these etch conditions, the surface of the PPMS/PPMSO top layer converts to a hard oxide etch mask, thereby protecting underlying material from etching. Thereafter, the etch gases are switched to generate a fluorine based plasma. Typical etch gases include fluorocarbons, hydrofluorocarbons, $SF_6$, $NF_3$, their mixtures, or any other plasma etch chemistry known to selectively etch oxide over the underlying low k organic material. The duration of this etch must be sufficient to remove both the partially exposed (i.e., thin regions) of PPMS/PPMSO imaging layer and the thin inorganic etch stop layer, but not to remove all of the completely exposed PPMS/PPMSO layer. The etch gases are switched back to give an oxygen based plasma. In this step, the lower layer of low k dielectric material is anisotropically etched down to the underlying substrate forming the contact via, while the now uncovered top layer is etched to form the trench (to be filled with metal to form the interconnect wire). Finally, it may be desirable (but not necessarily required) to perform a final etch step using a fluorine based plasma to remove the remaining top layer of PPMS/PPMSO and the exposed area of the inorganic etch stop layer. This etch sequence, which may be performed in a single chamber or in separate chambers, completes the fabrication of a low k dual damascene structure which may then be filled with metal to form an interconnect structure.

The same structure may also be formed using a positive tone development process. The first step of this process employs a mask structure essentially opposite to that of the negative tone process described above. Again either a single grey level mask (i.e., one having clear, partially absorbing (grey) areas, and totally absorbing (black areas) or a sequence of two ordinary masks is used to create a pattern in which some areas are totally exposed, some areas partially exposed, and some areas unexposed. For positive tone development, the areas in which the entire dielectric stack is to remain are unexposed, those areas to be removed in the upper layer of low k dielectric are partially exposed (this is the same as for the negative tone), and those areas to be removed in both layers are totally exposed.

Development of positive tone patterns is performed using either a wet etch process employing buffered oxide etch solutions or using HF vapor. Development time is controlled so as to remove all or essentially all of the PPMS/PPMSO in the totally exposed region, and some (the upper regions) of PPMS/PPMSO in the partially exposed regions, while leaving unexposed material essentially the same. The resulting bilevel pattern may then be transferred through the underlying layers using the same steps as described for the negative tone process.

It may also prove advantageous, for some applications, to add an additional step to the positive tone sequence in which the patterned PPMS mask is blanket exposed to UV light so as to uniformly oxidize it throughout its thickness. This is particularly the case if using positive tone development conditions in which some residue remains in the totally exposed regions. In such a case, it is necessary to add an additional step at the beginning of the dry etch sequence in which a fluorine based plasma etch is applied long enough to clear any residue remaining on the surface of the totally exposed regions. Even a thin layer of residue, if allowed to remain, may act as a mask to prevent etching of the underlying organic low k material.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

The present invention uses a silicon-based, photoresist material (e.g., plasma polymerized methylsilane (PPMS)) as an etch stop, hard mask or resist, to form a dual or single damascene structure. The PPMS is patterned using ultraviolet (UV) light in conjunction with either a conventional opaque mask or a grey tone mask.

The following description is divided into a plurality of sections that describe various embodiments of the present invention. Specifically, Section A discloses a dual damascene structure fabricated using a conventional opaque mask to define an interconnection pattern, Section B discloses a single damascene structure fabricated using a conventional opaque mask to define an interconnection pattern, and Section C describes the use of a grey tone mask to form a dual damascene structure.

A. Dual Damascene Structure

Figure 1A:
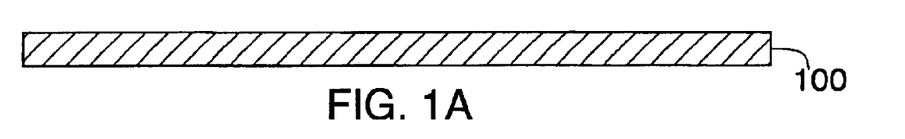
FIGS. 1A–1H depict a sequence of process steps in accordance with the present invention for fabricating a dual damascene structure using PPMS.
Figure 1B:
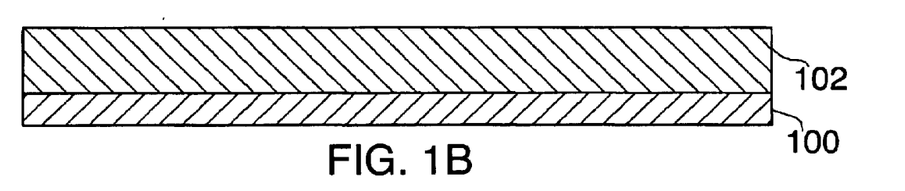

FIGS. 1A–1H depict the process steps utilized to fabricate a dual damascene structure in accordance with the present invention. FIG. 1A depicts a cross-sectional view of a semiconductor wafer substrate 100. FIG. 1B depicts a first layer 102 of an insulative material having low dielectric constant (low k material having a dielectric constant k<3.5) deposited upon the substrate 100. Such low k materials can include amorphous fluorinated carbon as well as other organic spin-on polymeric materials (e.g., PAE-2, Flare 2.0, SLK, and the like) or vapor deposited materials. The low k material is deposited onto the substrate using chemical vapor deposition (CVD), vapor deposition, or spin-on techniques. The film deposited onto the substrate has an approximate thickness of the depth of the via (e.g., 0.2 to 2 um).

Figure 1C:
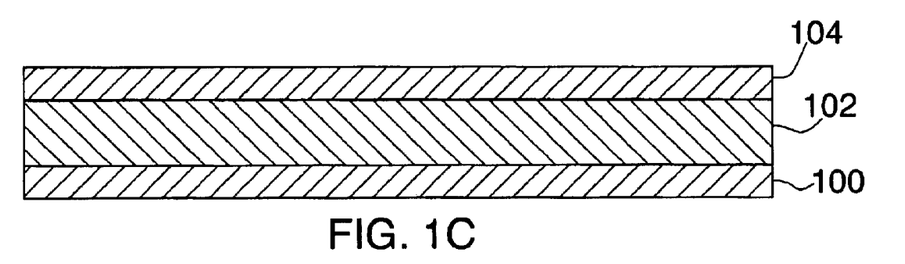

In FIG. 1C, a layer 104 of radiation sensitive, silicon-based, photoresist material (e.g., plasma polymerized methylsilane (PPMS)) is deposited using a chemical vapor deposition (CVD) process atop the low k material layer 102. Illustrative processes that are useful to deposit radiation sensitive organic materials (e.g., PPMS and other such materials) are disclosed in U.S. Pat. No. 5,439,780 issued Aug. 8, 1995 and herein incorporated by reference. The PPMS layer has an approximate thickness of 0.1 to 0.3 um. At the process step depicted in FIG. 1D, the PPMS layer 104 is selectively exposed to ultraviolet (UV) light which converts the exposed PPMS into an oxide, PPMSO, and leaves the unexposed areas of PPMS as PPMS. As such, the PPMS layer becomes a PPMS/PPMSO layer. The selective application of UV light is performed using deep UV (248 nm or 193 nm) steppers in the presence of air.

Figure 1D:
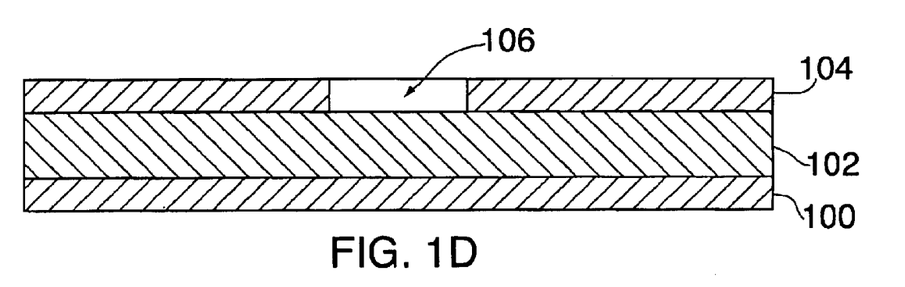

The patterns in the layer 104 are developed using a chlorine ($Cl_2$) or $Cl_2$/HBr-based plasma etch to remove the unexposed PPMS from the PPMS/PPMSO layer 104, leaving a pattern of apertures 106 within the PPMSO layer 104. The apertures 106 define the size and shape of the ultimate vias that will extend through the first insulator layer 102 to the substrate 100. The low k dielectric layer 102 is unaffected while etching the PPMS using a chlorine-based plasma etch.

Figure 1E:
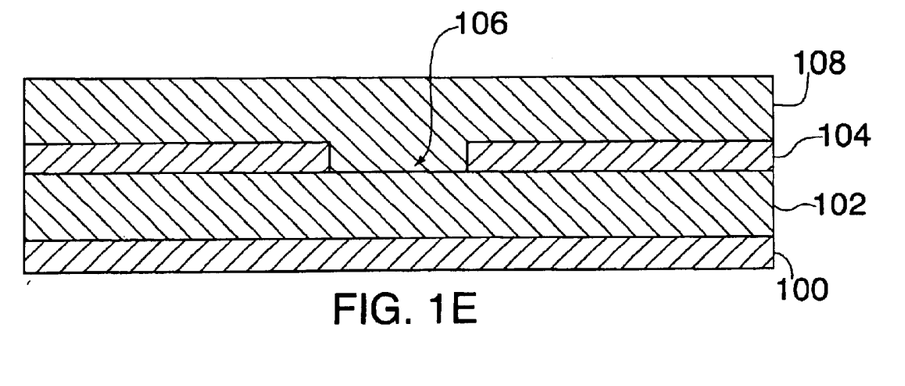
Figure 1F:
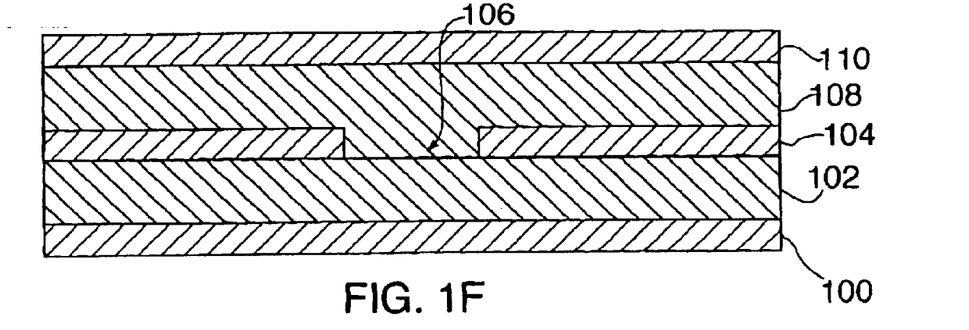
Figure 1G:
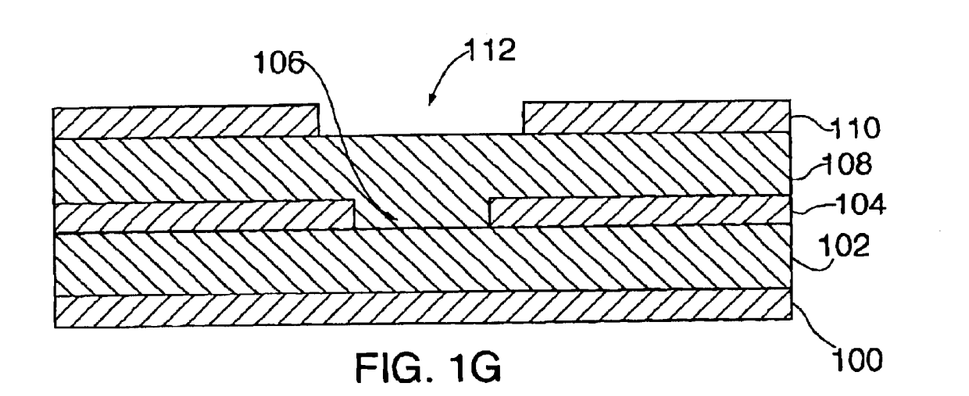
Figure 1H:
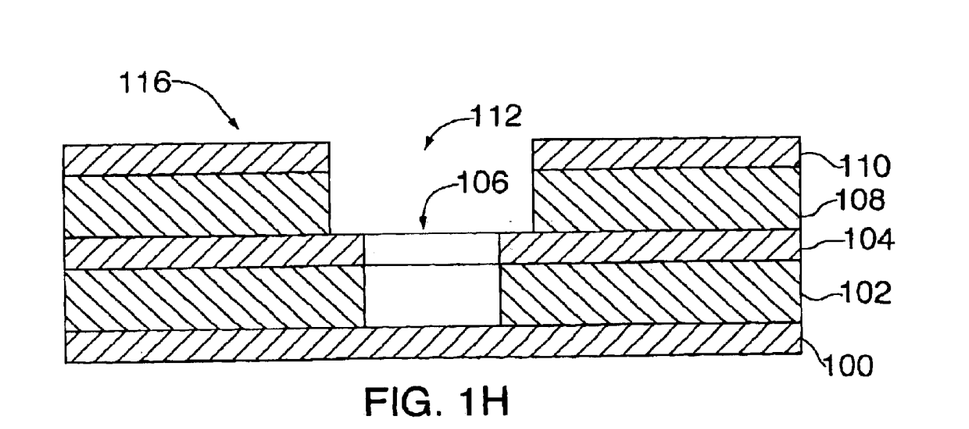

At the step depicted in FIG. 1E, a second low k insulative layer 108 is deposited to a thickness of approximately equal to the trench depth (e.g., 0.2 to 2 um) atop the layer 104. FIG. 1F depicts a second layer 110 of PPMS deposited via a CVD process atop the low k layer 108. In FIG. 1G, the PPMS layer 110 is patterned using ultraviolet light to create PPMSO in the exposed areas and leaving PPMS in the unexposed areas. This pattern defines trenches that are to be formed in the second insulative layer 108. Again, a chlorine or $Cl_2$/HBr-based plasma is used to remove the PPMS leaving a gap 112 in the layer 110 that defines the size and shape of the trench. The structure of FIG. 1G is then etched in an oxygen-based chemistry to selectively remove the low k material beneath gap 112 and aperture 106. FIG. 1H depicts across sectional view of the final dual damascene structure 116. The PPMSO acts as an oxide-like material which is not affected by the oxygen-based chemistry. Thus, the layer 110 serves as a hard mask to facilitate low k material etch, and layer 104 serves as an etch stop to maintain the via profile As such, the PPMSO provides an etch selectivity greater than 50, compared to a low k material such as a-C:F. It is this high resistance to oxygen plasma that makes PPMSO an excellent etch stop (layer 104) and a hard mask-type material (layer 110) for etching organic low k polymers using oxygen plasma.

Furthermore, the PPMS can be deposited at a relatively low temperature (e.g., 150° C.) such that various other low k materials can be used to form dual damascene structures that would otherwise not be available if high temperature (e.g., >350° C.) processing was required for etch stop or hard mask creation.

Figure 2:
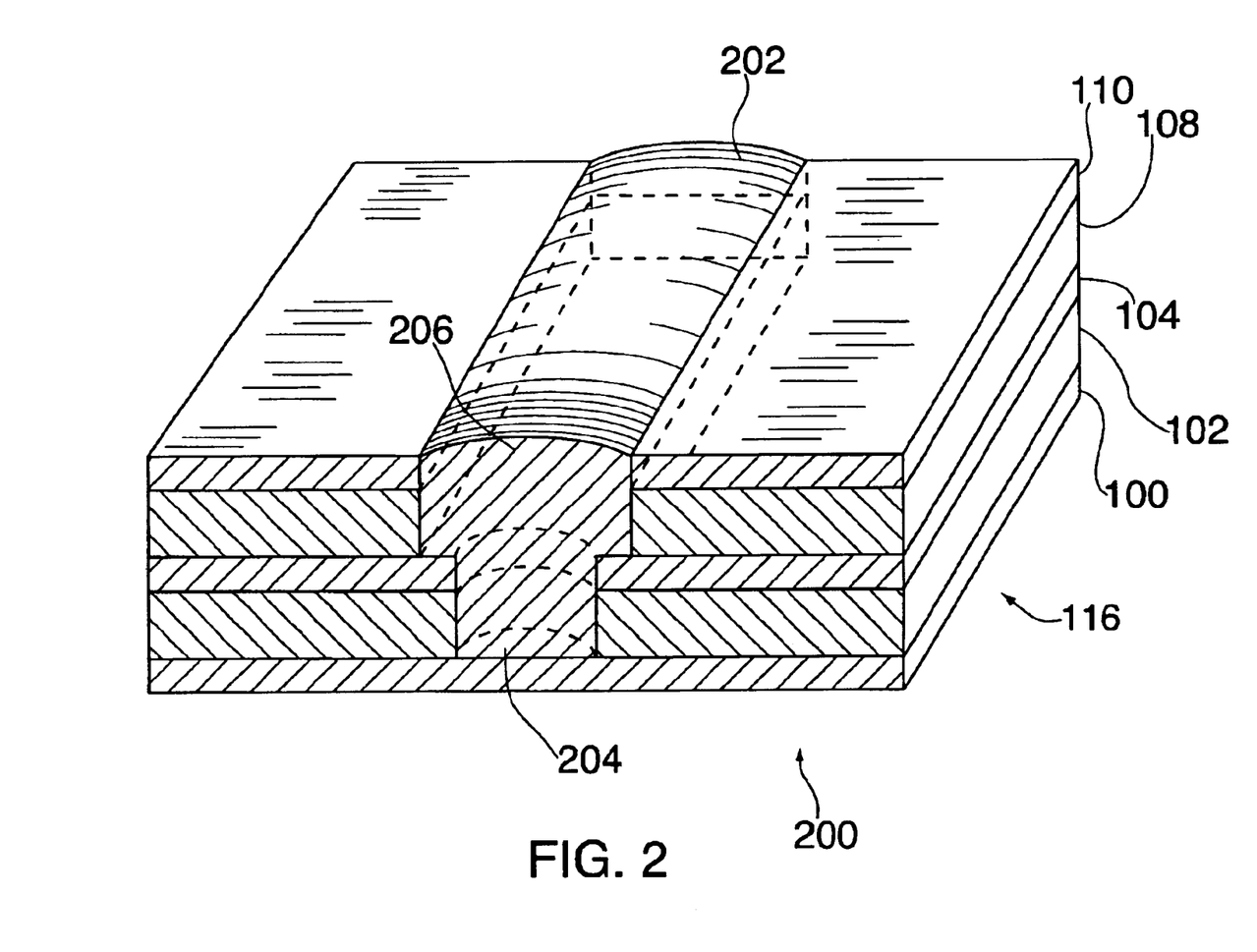
FIG. 2 depicts a cross-sectional perspective view of a complete dual damascene structure fabricated in accordance with the present invention.

FIG. 2 depicts a sectional, perspective view of a complete dual damascene structure 200 having a metallization 202 deposited into the damascene structure 116 that was created using the inventive steps depicted in FIGS. 1A–1H. The metallization is accomplished by physical vapor deposition (PVD), chemical vapor deposition (CVD), electoplating or electroless plating of a metal such as tungsten, copper or copper alloys, aluminum or aluminum alloys, metal alloys and the like onto the structure 116 of FIG. 1H. The metal simultaneously fills both the via 204 and the trench 206 to provide a conductive path to the substrate 100. The metal is then planarized using a conventional chemical-mechanical polishing (CMP) technique and passivated, i.e., cleaned using an $H_2$-based chemistry and a silicon-nitride deposition of a passivation layer.

Alternatively, the metallization is accomplished using a combination of CVD and PVD deposition, where a thin layer of metal (a liner) deposited using a CVD process and a filler is deposited using a PVD deposition. A detailed description of this sequential CVD/PVD process is disclosed in commonly assigned U.S. Pat. No. 5,877,078 filed Nov. 21, 1995, incorporated herein by reference. Other techniques for filling a damascene structure include those disclosed in commonly assigned U.S. Pat. Nos. 5,371,042, issued Dec. 6, 1994 and 5,443,995 issued Aug. 22, 1995.

In addition, a low temperature (<150° C.) deposition of PPMS-based etch stop and resist combined with electroless or electroplated metal such as copper and its alloys (e.g., Cu-Sn, Cu-Mg and the like) provides an overall low temperature process to fabricate a dual damascene structure that is compatible with all low K materials.

B. Single Damascene Structure

Figure 3A:
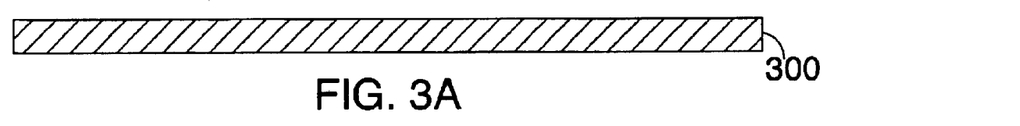
FIGS. 3A–3I depict a sequence of process steps in accordance with the present invention for fabricating a single damascene structure using PPMS.
Figure 3B:
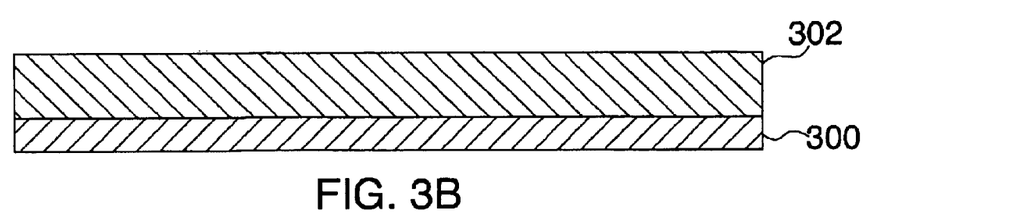
Figure 3C:
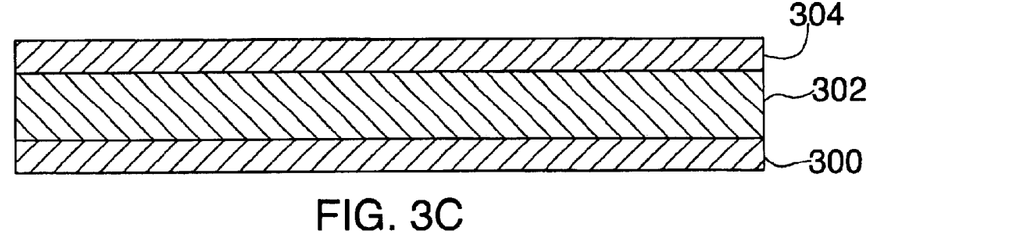

The foregoing process of producing a dual damascene structure can be adapted to produce a single damascene structure. FIG. 3A through 3I depict the process steps for generating a single damascene structure 326 in accordance with the present invention. FIG. 3A depicts a cross-sectional view of a semiconductor wafer substrate 100. FIG. 1B depicts a first layer 302 of a material having a low dielectric constant deposited upon the substrate 300. Such a low k material includes any carbon based organic polymer. The low k material is deposited onto the substrate using CVD, vapor deposition, or spin-on technique. The film is deposited onto the substrate to an approximate thickness of a via, e.g., 0.2 to 2 um.

In FIG. 1C, a layer 304 of silicon-based photoresist material (e.g., plasma polymerized methylsilane (PPMS)) is deposited using a chemical vapor deposition (CVD) process atop the low k material layer 302. The PPMS layer has an approximate thickness of 0.1 to 0.3 micrometers. At the process step depicted in FIG. 3D, the PPMS layer 304 is selectively exposed to ultraviolet light which converts the exposed PPMS into an oxide, PPMSO, and leaves the unexposed areas of PPMS as PPMS. As such, the PPMS layer becomes a PPMS/PPMSO layer. The selective application of UV light is performed using deep UV (240 nm or 193 nm) steppers in the pressure of ambient air and a patterned photoresist mask positioned over the PPMS layer 104 while the layer is illuminated with UV light.

Figure 3D:
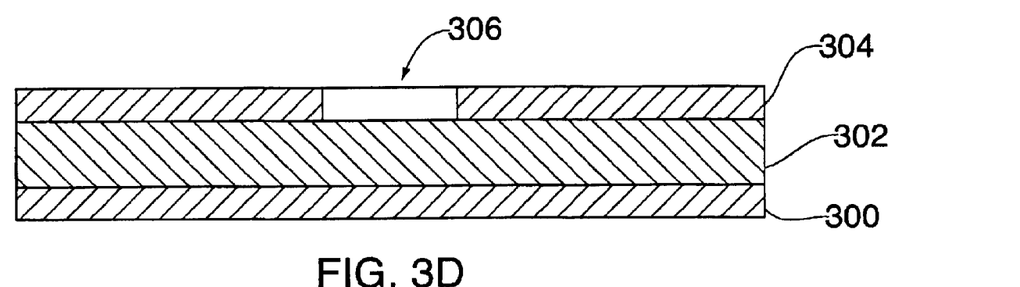

The pattern in the layer 304 is developed using a chlorine-based plasma etch to remove the unexposed PPMS from the PPMS/PPMSO layer 304, leaving a pattern of apertures 106 within the PPMSO layer 304. The apertures 306 define the size and shape of the ultimate vias that will extend through the first insulator layer 302 to the substrate 100. The low k dielectric layer 302 is unaffected while etching the PPMS with an chlorine-based etchant.

Figure 3E:
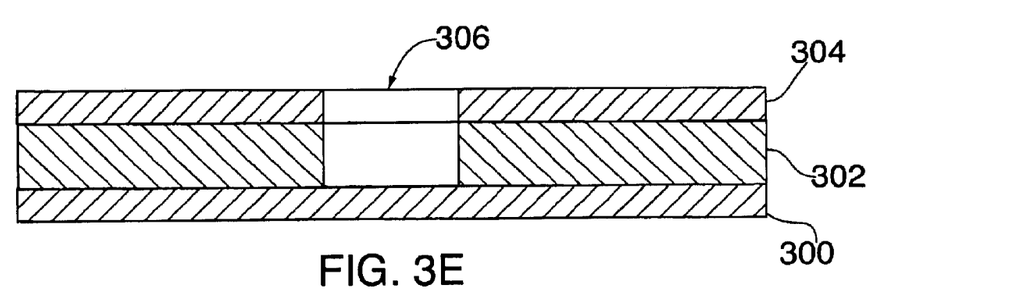

At the step depicted in FIG. 3E, the structure is then etched in an oxygen-based chemistry to selectively remove the low k material beneath aperture 306. The PPMSO acts as an oxide-type material which is not affected by the oxygen-based chemistry and serves as an hard mask that limits the amount of low k material that is removed outside of the aperture 306.

Figure 3F:
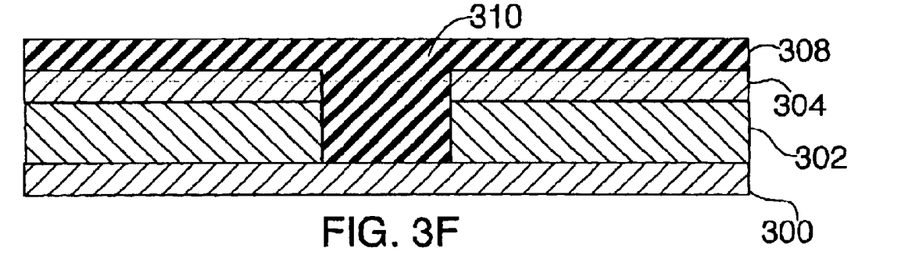
Figure 3G:
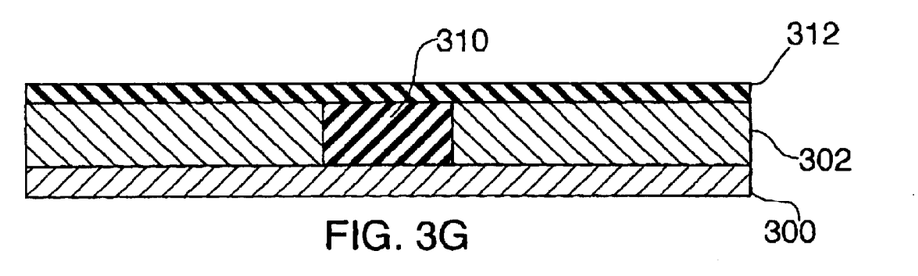

In FIG. 3F, a metallization layer 308 is deposited upon the single damascene structure to fill the aperture 306 with metal. Metallization can be accomplished in any one of the previously discussed metallization processes and techniques. Using polishing techniques such as chemical-mechanical polishing (CMP), the metal that covers the top layer of the structure is removed, thereafter the PPMSO layer is also removed by CMP. Such polishing planarizes the rmetallization leaving only material in the via area 310. Thereafter, as shown in FIG. 3G, a copper passivation layer 312 is deposited over the structure, i.e., the planarized metal is cleaned using an $H_2$-based chemistry and a passivation layer, for example, silicon-nitride is deposited atop the copper metallization.

Figure 3H:
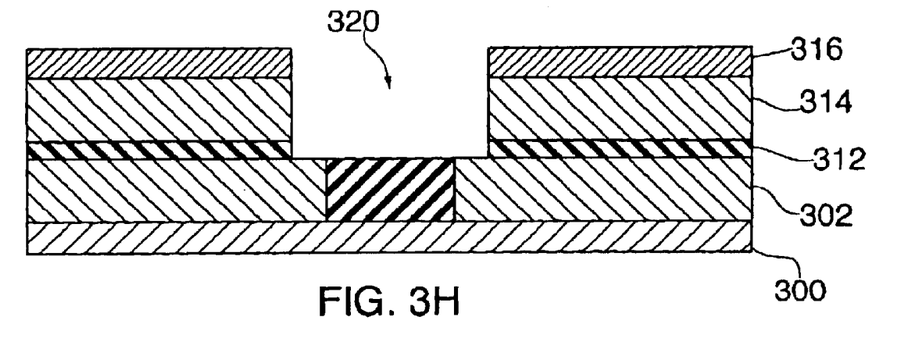
Figure 3I:
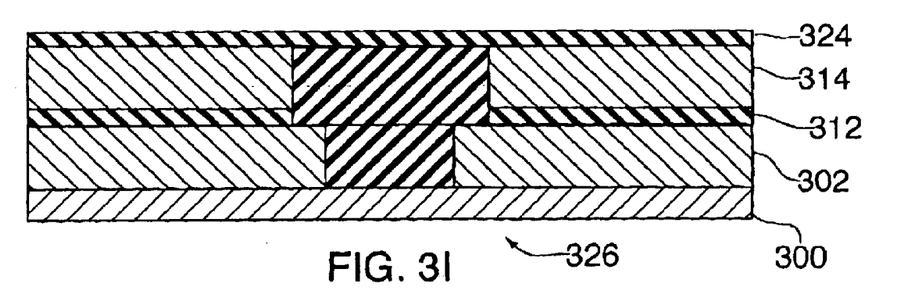

Steps 3B through 3E are then repeated to add the upper portion of the single damascene structure 326. This repeated structure creates the trench portion of the interconnections. Specifically, as depicted in FIG. 3H, a second layer low K material 314 is deposited over the passivation layer 312, then a layer of PPMS is deposited, patterned and etched in a chlorine etchant as discussed above. The PPMSO layer 316 defines the trench dimensions. The PPMSO layer is then used as an etch stop as the trench 320 is formed using an oxygen-based chemistry to remove the PPMS. Lastly, the copper passivation layer 312 is etched in the aperture area 306 using a non-oxygen-based chemistry (e.g., fluorine-based) to remove a portion of the passivation layer to facilitate contact with the metal of layer 308. Once the trench is formed (a portion of (FIG. 3G), the trench is metallized and planarized. Lastly, the copper passivation layer 324 is deposited atop the entire structure 326. Before the copper passivation, it may be necessary to clean up the surface oxidation of the copper using such methods as an $H_2$ treatment.

As with the dual damascene structure, the single damascene structure utilizes the PPMSO as an etch stop and a hard mask type material for etching the low k polymers within an oxygen plasma. Such use of PPMS provides a superb etch selectivity when etching organic low k materials.

C. Damascene Structure Formed Using A Grey Tone Mask

In an alternative embodiment of the invention, a dual damascene structure is fabricated using a single lithography step and a single development and pattern transfer etch sequence. As such, the process by which a dual damascene structure is fabricated is substantially simplified.

This approach takes advantage of the combination of unique features of PPMS to form a dual damascene structure. Specifically, the inventive process utilizes the ability to control the degree of photo-oxidation with respect to UV exposure, which in turn will determine the amount of PPMS or PPMSO (depending on development process tone: positive or negative) remaining in the layer. As such, the technique forms a bilevel structure using a single lithography step employing a two-tone (gray-scale) mask, or a sequence of exposures using two standard masks. This approach is aimed specifically at the patterning of dual damascene structures in low k organic polymer or amorphous carbon based films, which may be etched with high selectivity through a PPMS/PPMSO masking layer using an oxygen-based plasma. In such a pattern transfer step, the surface of the PPMS/PPMSO layer is converted into an $SiO_2$ hard mask.

Figure 4A:
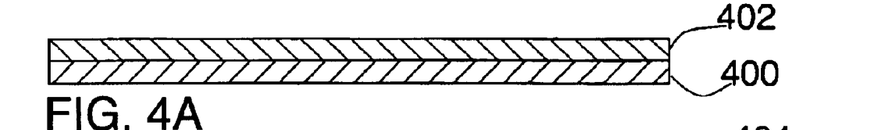
FIGS. 4A–4J depict a sequence of process steps for fabricating a dual damascene structure in accordance with an alternative embodiment of the invention.
Figure 4B:
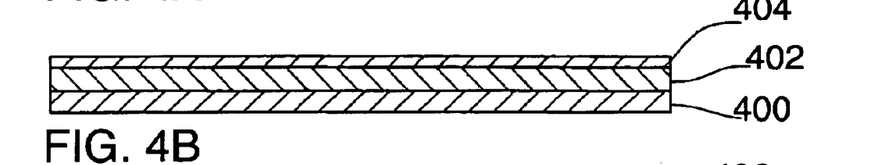
Figure 4C:
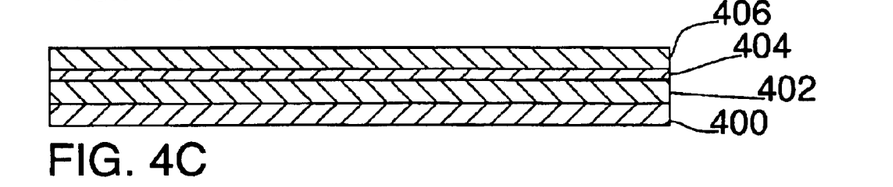
Figure 4D:
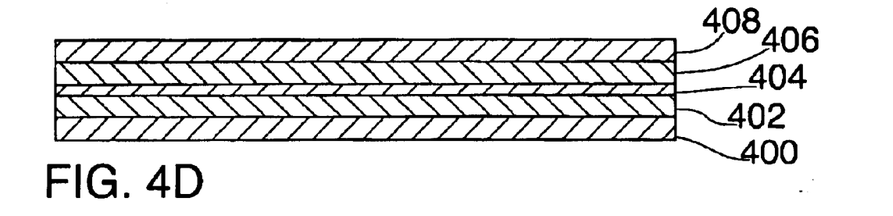

FIGS. 4A–4J depict the specific process steps for producing a dual damascene structure using a grey tone mask. FIG. 4A depicts a low k material layer 402 deposited upon a substrate 400. In FIG. 4B, an etch stop layer 404 is deposited upon the layer 402. The etch stop in this embodiment can be any form of etch stop that is applicable to the materials used in the structure. For example, a conventional silicon dioxide or silicon nitride etch stop can be used. In FIG. 4C, a second low k material layer 406 is deposited over the etch stop layer 404. The final layer used to form the dual damascene structure is a layer 408 of a radiation sensitive, silicon-based, CVD photoresist material such as PPMS that is deposited over the second low k material layer 406. See FIG. 4D.

Figure 4E:
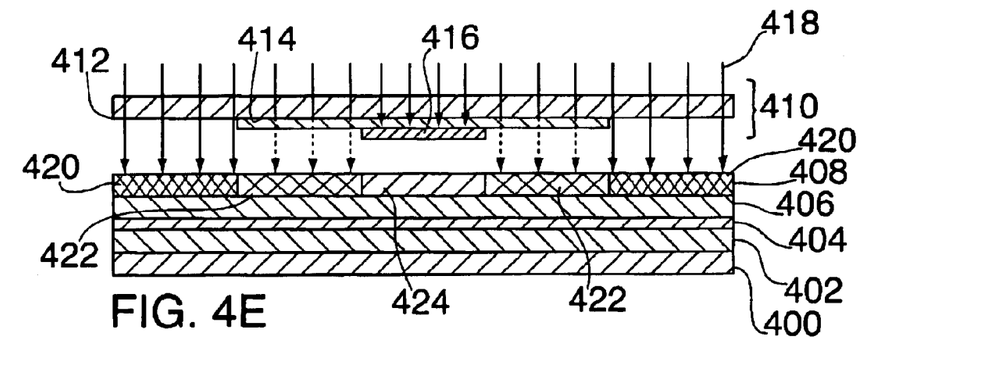

As depicted in FIG. 4E, the combination of trench and contact vias are patterned in a single step using a grey tone mask 410 (i.e., a mask having transparent portion 412, partially absorbing (grey) portion 414, and totally absorbing portion 416). Alternatively, a sequence of two ordinary, opaque masks can be used to create a pattern in which some areas of the PPMS layer 408 are totally exposed, some areas partially exposed, and some areas unexposed. Thus, the grey tone mask permits the UV radiation (arrows 418) to fully expose region 420 of the PPMS layer 408, partially expose region 422 and not expose region 424. For negative tone applications, those areas of the dielectric stack intended to remain unetched are completely exposed, those areas to be removed in the upper layer of low k dielectric (the trench) are partially exposed, and those areas to be removed in both layers (i.e., the contact vias) remain unexposed.

Figure 4F:
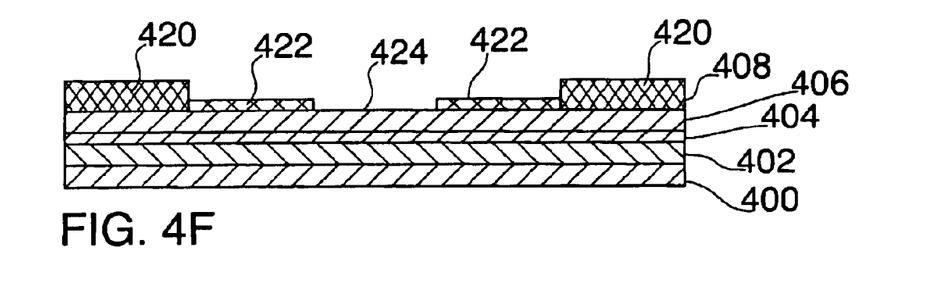

Once the PPMS layer 408 is exposed as described above, the PPMS development, trench, and via etch is then conducted in a single etch sequence, which is depicted in FIGS. 4F through 4I. In FIG. 4F, PPMS development is performed using a $Cl_2$ or $Cl_2$/HBr based plasma etch for a time sufficient to remove all of the completely unexposed PPMS and part of the partially exposed PPMS. The amount of PPMS left behind in the partially exposed area will depend on the relative amount of light (i.e., the percent transmission of the gray tone mask area 414) and the total etch time (including overetch time) necessary to clear the unexposed regions 424 of PPMS layer 408. The thickness of material remaining in the partially exposed area 422 is thereby controlled by choice of initial film thickness, exposure level, and overetch time such that it may be removed in the same etch time (FIG. 4H below) necessary to remove a thin inorganic (oxide or nitride layer) etch stop layer 404 between the two layers 402 and 406 of organic dielectric material.

Figure 4G:
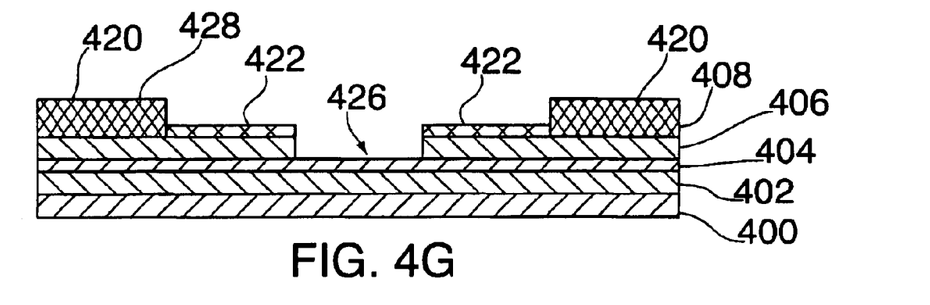

In FIG. 4G, the etch gases are switched to an oxygen-based mixture (including pure oxygen, or oxygen with N2, $CO_2$, CO, $SO_2$, or other additives) so as to selectively and anisotropically etch through the second layer 406 of the organic low k dielectric 406 to form opening 426 and stop on the thin inorganic etch stop layer 404. Under these etch conditions, the surface 428 of the PPMS/PPMSO layer 408 converts to a hard oxide etch mask, thereby protecting underlying material from etching.

Figure 4H:
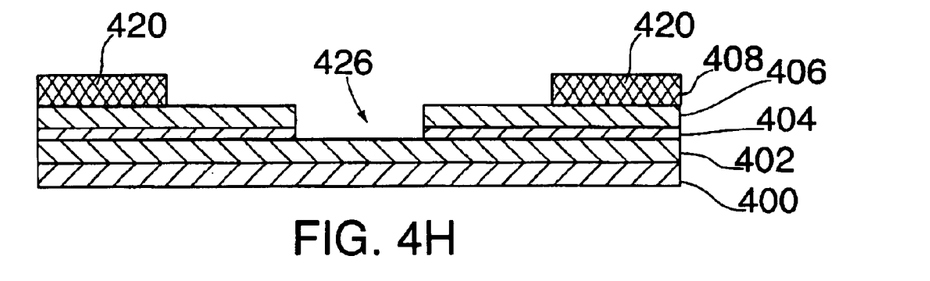
Figure 4I:
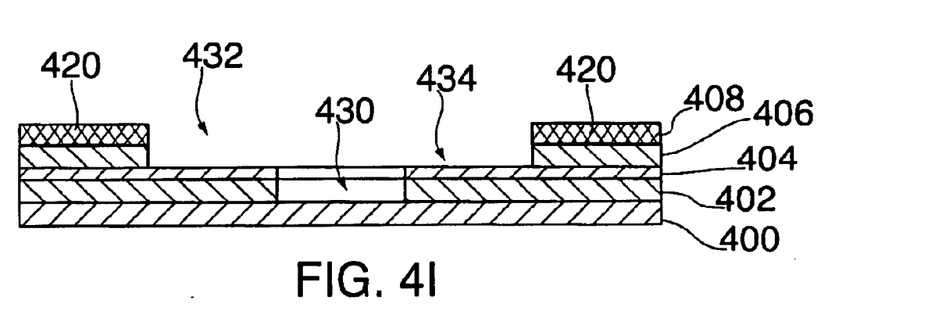
Figure 4J:
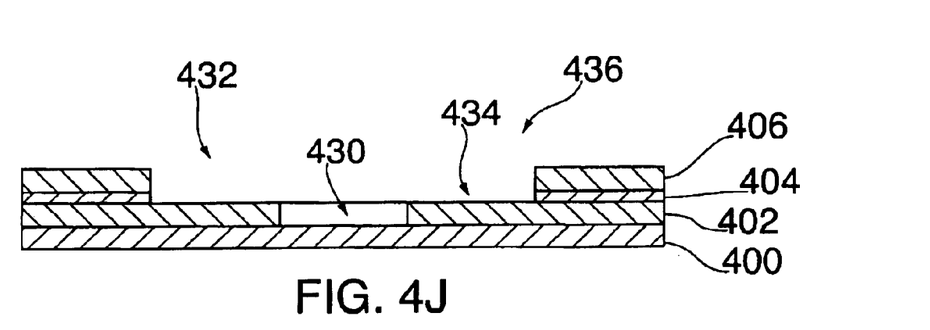

In FIG. 4H, the etch gases are switched to generate a fluorine-based plasma. Typical etch gases include fluorocarbons, hydrofluorocarbons, $SF_6$, $NF_3$, their mixtures, or any other plasma etch chemistry known to selectively etch oxide over the underlying low k organic material. The duration of this etch must be sufficient to remove both the partially exposed (i.e., thin regions 422) of PPMS/PPMSO layer 408 and the thin inorganic etch stop layer 404, but not to remove all of the completely exposed portion 420 of PPMS/PPMSO layer 408. In FIG. 4I, the etch gases are switched back to give an oxygen based plasma as in FIG. 4G. In this step the first layer 402 of low k dielectric material is anisotropically etched down to the underlying substrate forming the contact via 430, while the now uncovered second layer 406 is etched to form the trench 432 (to be filled with metal to form the interconnect wire). Finally, it may be desirable (but not necessarily required to perform a final etch step (shown in FIG. 4J) using a fluorine-based plasma to remove the remaining layer 408 of PPMS/PPMSO and the exposed area 434 of the inorganic etch stop layer 404. This etch sequence, which may be performed in a single chamber or in separate chambers, completes the fabrication of a low k dual damascene structure 436 which may then be filled with metal as described above with respect to FIG. 2 to form an interconnect structure.

The same structure may also be formed using a positive tone development process. This process would employ a mask structure essentially opposite to that of the negative tone process i.e., no exposure in region 420, partial exposure in region 422 and full exposure of region 424. Again either a single gray level mask (i.e., one having transparent portion, partially absorbing (grey) portion, and totally sorbing (black portion) or a sequence of two ordinary masks is used to create a pattern in which some areas are totally exposed, some areas partially exposed, and some areas unexposed. For positive tone development, the areas in which the entire dielectric stack is to remain are unexposed, those areas to be removed in the upper layer of low k dielectric are partially exposed (this is the same as for the negative tone), and those areas to be removed in both layers are totally exposed.

Development of positive tone patterns is performed using either a wet etch process employing buffered oxide etch (BOE) solutions (e.g., a 7:1 BOE), as described in U.S. Pat. No. 5,439,780. Development time is controlled so that to remove all or essentially all of the PPMS/PPMSO in the totally exposed region, and some (the upper regions) of PPMS/PPMSO in the partially exposed regions, while leaving unexposed material essentially the same. The resulting bilevel pattern may then be transferred through the underlying layers using the steps depicted in FIGS. 4F–4J as described for the negative tone process.

It may also prove advantageous, for some applications, to add an additional step to the positive tone sequence between the PPMS mask etch step and the oxygen-based etch step in which the patterned PPMS mask is blanket exposed to UV radiation so as to uniformly oxidize it throughout its thickness. This is particularly useful if using positive tone development conditions in which some residue remains in the totally exposed regions. In such a case, it is necessary to add an additional step at the beginning of the dry etch sequence in which a fluorine-based plasma etch is applied long enough to clear any residue remaining on the surface of the totally exposed regions. Even a thin layer of residue, if allowed to remain, may act as a mask to prevent etching of the underlying organic low k material.

Although various embodiments which incorporate the teachings of the present invention have been shown and described in detail herein, those skilled in the art can readily devise many other varied embodiments that still incorporate these teachings.

What is claimed is:

1. A damascene structure comprising:

a first insulator layer;

a layer of silicon-based photosensitive material deposited atop said first insulator layer, having an opening that defines a via in said layer of silicon-based photosensitive material; and a second insulator layer, deposited atop said layer of silicon-based photosensitive material, having a trench formed in said second insulator layer and intersecting said via, wherein said silicon-based photosensitive material is plasma polymerized methylsilane oxide (PPMSO).

2. The damascene structure of claim 1 wherein said first and second insulator layers are fabricated of a low dielectric constant material.

3. The damascene structure of claim 1 wherein said first and second insulator layers are fabricated of a material having a dielectric constant of less than 3.5.

4. The dual damascene structure of claim 1 wherein said first and second insulator layers are an amorphous fluorinated carbon material.

5. A damascene structure comprising:

a first insulator layer;

a layer of silicon-based photosensitive material deposited atop said first insulator layer, having an opening that defines a via in said layer of silicon-based photosensitive material; and a second insulator layer, deposited atop said layer of silicon-based photosensitive material, having a trench formed in said second insulator layer and intersecting said via, wherein the thicknesses of the first and second insulator layers are about two to seven times greater than the thickness of the layer of silicon-based photosensitive material.

6. The damascene structure of claim 5 wherein said silicon-based photosensitive material is plasma polymerized methylsilane oxide (PPMSO).

7. The damascene structure of claim 5 wherein said first and second insulator layers are fabricated of a low dielectric constant material.

8. The damascene structure of claim 5 wherein said first and second insulator layers are fabricated of a material having a dielectric constant of less than 3.5.

9. The dual damascene structure of claim 5 wherein said first and second insulator layers are an amorphous fluorinated carbon material.

* * * * *